US007626855B2

(12) United States Patent
Kodama et al.

(10) Patent No.: US 7,626,855 B2
(45) Date of Patent: Dec. 1, 2009

(54) SEMICONDUCTOR MEMORY DEVICE

(75) Inventors: Noriaki Kodama, Kanagawa (JP);
Kenichi Hidaka, Kanagawa (JP)

(73) Assignee: NEC Electronics Corporation,
Kawasaki, Kanagawa (JP)

( * ) Notice: Subject to any disclaimer, the term of this patent is extended or adjusted under 35 U.S.C. 154(b) by 102 days.

(21) Appl. No.: 11/892,277

(22) Filed: Aug. 21, 2007

(65) Prior Publication Data

US 2008/0049515 A1    Feb. 28, 2008

(30) Foreign Application Priority Data

Aug. 22, 2006   (JP)   ............................. 2006-225169

(51) Int. Cl.
*G11C 11/00*   (2006.01)
(52) U.S. Cl. .................. 365/156; 365/154; 365/230.05
(58) Field of Classification Search ................. 365/156, 365/154, 230.05, 189.04, 181, 182, 190
See application file for complete search history.

(56) References Cited

U.S. PATENT DOCUMENTS 6,118,689 A * 9/2000 Kuo et al. .................. 365/154
7,345,909 B2 * 3/2008 Chang et al. ................ 365/154
7,362,606 B2 * 4/2008 Chuang et al. .............. 365/154
2001/0038552 A1 * 11/2001 Ishimaru ..................... 365/181
2007/0278531 A1 * 12/2007 Choi et al. ................... 257/213
2007/0285997 A1 * 12/2007 Shiota et al. ........... 365/189.08

FOREIGN PATENT DOCUMENTS

| JP | 2004-281971 | 10/2004 |
|---|---|---|
| JP | 2005-191506 | 7/2005 |
| JP | 2005-252267 | 9/2005 |
| JP | 2005-353106 | 12/2005 |

* cited by examiner

*Primary Examiner*—Dang T Nguyen
(74) *Attorney, Agent, or Firm*—McGinn IP Law Group, PLLC

(57) ABSTRACT

Obtained is a highly-reliable non-volatile memory without increasing the area of a memory cell or adding a step to a CMOS process. The non-volatile memory includes an SRAM cell configured of 6 MOS transistors, a first word line electrically connected to the gate of a first transfer MOS transistor, and a second word line electrically connected to the gate of a second transfer MOS transistor. During a write operation of a first PMOS transistor, a drive circuit applies a positive voltage whose absolute value is not larger than a junction breakdown voltage to an n-type well as well as the sources of first and second PMOS transistors, concurrently applying the positive voltage to the first word line and a ground voltage to the second word line and a first data line.

14 Claims, 4 Drawing Sheets

(EMBODIMENT 1)

(EMBODIMENT 1)

(EMBODIMENT 1)

|  | Program P1 | Program P2 | Read |
|---|---|---|---|
| NW | VPP | VPP | VCC |
| VDD | VPP | VPP | VCC |
| VSS | FLOAT | FLOAT | GND |
| W1 | VPP | GND | VCC |
| D1 | GND | FLOAT | Data |
| W2 | GND | VPP | VCC |
| D2 | FLOAT | GND | Bar Data |
| Vsub | GND | GND | GND |

Fig. 7

|  | VNL | VNR | VS | VCC | Vsub |
|---|---|---|---|---|---|
| Program | <-Vbe | 0V | 0V | <-BVj | 0V |
| Read | Vcc | Vcc | 0V | Vcc | 0V | ary # SEMICONDUCTOR MEMORY DEVICE

BACKGROUND OF THE INVENTION

1. Field of the Invention

The present invention relates to a semiconductor memory device including an SRAM cell.

2. Description of Related Art

There are semiconductor memory devices of a type which includes a memory cell where two PMOS transistors are connected to each other in series, one of the two PMOS transistors being used as a selection transistor including a selection gate whose voltage is controlled, and the other of the two PMOS transistors being used as a storage node including a floating gate whose voltage is not controlled (see Japanese Patent Application Laid-open Publications Nos. 2004-281971 and 2005-252267, for example). Writing to this type of memory cell is performed through drain avalanche hot electron injection into the floating gate in the storage node. The memory cells disclosed in Japanese Patent Application Laid-open Publications Nos. 2004-281971 and 2005-252267 have a configuration including a floating gate. Accordingly, a gate insulating film under the floating gate usually needs to be not smaller than 8 to 9 nm in thickness for the purpose of preventing the charges retention characteristic from deteriorating as a result that the floating gate loses electric charges. As the gate insulating film is thinner, deficiency increases in the insulating film serving as a pathway through which electrons accumulated in the floating gate are lost. This brings about a problem that the charges retention characteristic deteriorates extremely, and that the reliability accordingly decreases.

With this taken into consideration, disclosed are semiconductor memory devices of a type which includes no floating gate, and which performs write operations by changing the threshold voltage Vt in the MOS by use of the channel hot electron injection theory or the substrate hot electron injection theory (see Japanese Patent Application Laid-open Publications Nos. 2005-353106 and 2005-191506, for example). Vt shift usually does not take place so much in this case as any other transistor including a floating gate. For this reason, a configuration for an SRAM cell is adopted as a configuration for a memory cell included in a semiconductor memory device. This configuration makes it possible to sense a minute Vt change in the transistor.

Japanese Patent Application Laid-open Publication No. 2005-353106 (hereinafter referred to as "Patent Document 3") discloses a semiconductor memory device in which two n-channel MISFETs (MNM1, MNM2) are connected to two storage nodes in a static semiconductor memory cell (SRAM) configured of 6 MIS transistors, and which includes a p-channel MISFET (MPEQ) connecting drains of the two n-channel MISFETs (MNM1, MNM2) (see FIG. 4). Gates of two transfer transistors T1 and T2 in the static semiconductor memory cell (SRAM) are connected to a single word line WL. A read operation of this memory cell is performed as follows. First, a threshold voltage Vt of one of the two n-channel MISFETs MNM1 and MNM2 is changed by use of the channel hot electron injection theory. Thus, the transfer transistors T1 and T2 are turned on. Thereby, the difference in electric current between the drains of the two respective n-channel MISFETs MNM1 and MNM2 is read to determine stored data.

Japanese Patent Application Laid-open Publication No. 2005-191506 (hereinafter referred to as "Patent Document 4") discloses a vertical bipolar transistor which is configured of a source of a MOS transistor, a well, a substrate and a deep well, and in which electric charges (trap holes 473) are accumulated in a gate oxide film 465 and an oxide film side spacer 468 near the source so that Vt and Ion are changed (see FIG. 5). A method of injecting electric charges into the gate oxide film 465 and the oxide film side spacer 468 (a write operation) is performed as follows (see FIG. 7). For example, Vsub=0V is applied to a p-type silicon substrate 461; VN=−1V (VN<−Vbe: Vbe denotes a bias voltage) is applied to an n-type well 463 in order that the n-type well can be biased forwardly; and VS=0V is applied to a source 469. Thereby, hot holes 472 injected from the p-type silicon substrate 461 to the n-type well 463 are accelerated toward a vicinity of the source 469. By use of the substrate hot hole theory, trap holes 473 are injected into the gate oxide film 465 and the oxide film side spacer 468 near the source. The memory cell is configured as an SRAM using the operated PMOS as a load transistor (see FIG. 6).

In the case of Patent Document 3, in addition to the static semiconductor memory cell (SRAM), and the semiconductor memory device includes the n-channel MISFET (MNM1, MNM2) and the p-channel MISFET (MPEQ) for each memory cell. This brings about a problem that the transistors increase in number, and that the area of the memory cell accordingly increases.

In the case of Patent Document 4, a write operation needs the negative voltage (VN<−Vbe) for the purpose of accumulating charges (trap holes 473) in the gate oxide film 465 and the oxide film side spacer 468 near the source. This brings about a problem that the peripheral circuit is complicated. In addition, hot holes 472 have a higher barrier against the oxide film side spacer 468 than electrons. So that, the efficiency of injecting hot holes 472 into the oxide film side spacer 468 is actually low, and that Vt change occurring due to a write operation is small, and this brings about a problem that a write rate is low.

Patent Document 4 shows an example in which its disclosed technique is applied to a PMOS transistor. Nevertheless, its disclosed technique can be applied to an NMOS transistor in principle. A write operation can be performed on a deep n-type well as well as a gate oxide film and an oxide film side spacer of an NMOS transistor formed in a p-type well by use of the theory of substrate hot electron injection. In this case, however, the deep n-type well is necessary. For this reason, a step of forming a deep n-well needs to be added to a CMOS process which does not include a step of forming the deep n-well. This entails additional costs.

SUMMARY OF THE INVENTION

An aspect of the present invention is a semiconductor memory device including an SRAM cell, including: first and second PMOS transistors formed on an n-type well; first and second NMOS transistors formed on a p-type well; a first transfer MOS transistor, a source of the first transfer MOS transistor being electrically connected to a first data line, and a drain of the first transfer MOS transistor being electrically connected to a drain of the first PMOS transistor, a source of the first NMOS transistor, a gate of the second PMOS transistor and a gate of the second NMOS transistor; a second transfer MOS transistor, a source of the second transfer MOS transistor being electrically connected to a second data line, and a drain of the second transfer MOS transistor being electrically connected to a drain of the second PMOS transistor, a source of the second NMOS transistor, a gate of the first PMOS transistor and a gate of the first NMOS transistor; a first word line electrically connected to a gate of the first transfer MOS transistor; a second word line electrically connected to a gate of the second transfer MOS transistor; and a drive circuit for controlling voltages applied to at least the n-type well, the sources of the first and second PMOS transistors, the drains of the first and second NMOS transistors, the first word line, the second word line, the first data line, and the second data line. During a write operation of the first PMOS transistor, the drive circuit applies a positive voltage whose absolute value is not larger than a junction breakdown voltage to the n-type well as well as the sources of the first and second PMOS transistors, concurrently applies the positive voltage to the first word line, a ground voltage to the second word line, and the ground voltage to the first data line.

In the case of the semiconductor memory device according to the present invention, it is desirable that, during a write operation of the second PMOS transistor, the drive circuit should apply the positive voltage whose absolute value is not larger than the junction breakdown voltage to the n-type well as well as the sources of the first and second PMOS transistors, concurrently applying the positive voltage to the second word line, the ground voltage to the first word line, and the ground voltage to the second data line.

In the case of the semiconductor memory device according to the present invention, it is desirable that, during a read operation, the drive circuit,should apply a positive voltage to the n-type well as well as the sources of the first and second PMOS transistors, concurrently applying a ground voltage to the drains of the first and second NMOS transistors, and a positive voltage to both the first and second word lines.

In the case of the present invention, a write operation is performed by accumulating electrons in gate insulating films of the first and second PMOS transistors instead of in a floating gate including a tunnel oxide film. This makes it possible to provide a highly-reliable semiconductor memory device having a high retention characteristic even through a CMOS process including forming thin gate insulating films without any modification. In addition, because the write operation is performed by accumulating electrons in the gate insulating films of the first and second PMOS transistors, electrons trapped in the gate insulating films are unable to move and are fixed there. For this reason, it is only parts of electrons that leak from a vicinity of defects in the gate insulating films, even if the gate insulating films are defective. The defects do not affect most of the trapped electrons. This makes it possible to realize a non-volatile memory having a highly-reliable retention characteristic even through a process including forming thin gate insulating films. Moreover, because no negative voltage is used during the write operation, the peripheral circuit is simplified. Additionally, because the write operation is performed on the first and second PMOS transistors by use of the drain avalanche hot electron injection theory, the injection efficiency is high. This makes it possible to increase the write rate.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 7 is an explanatory diagram showing examples of voltage conditions for operating the source-line-division p-channel non-volatile memory cell included in the semiconductor device according to Example 4.

DESCRIPTION OF THE PREFERRED EMBODIMENT

Embodiment 1

Figure 1:
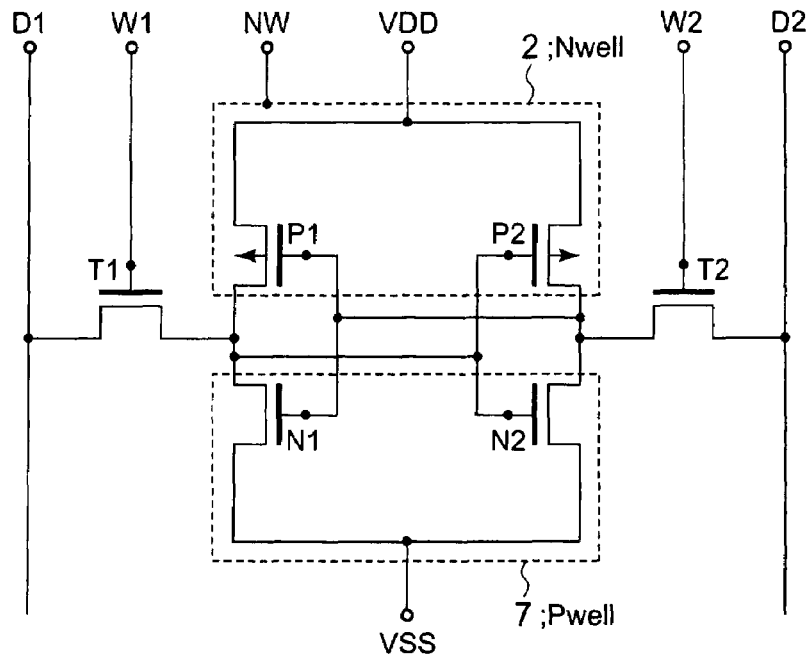
FIG. 1 is a circuit diagram schematically showing a configuration of a memory cell in the semiconductor memory device according to Embodiment 1 of the present invention.
Figure 2:
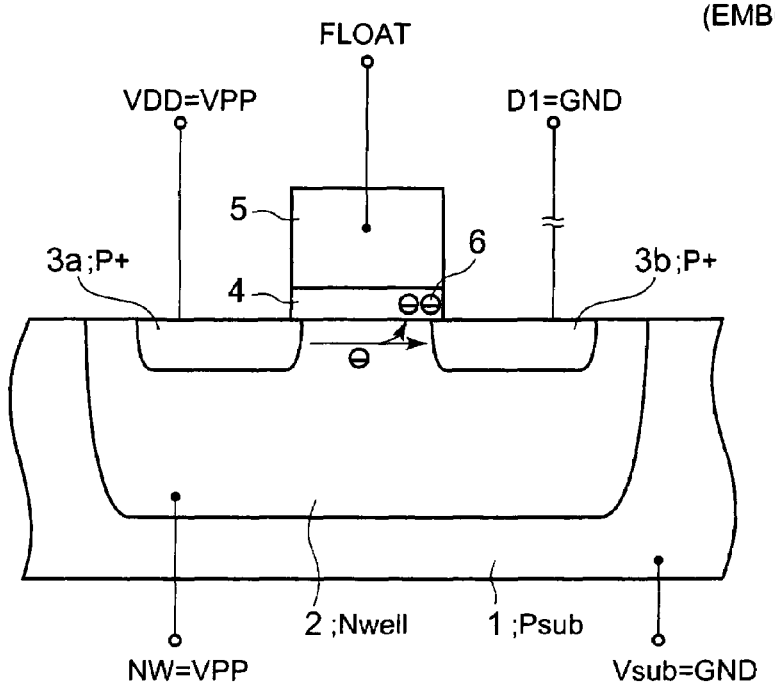
FIG. 2 is a partially cross-sectional view schematically showing a configuration of a first PMOS transistor in the memory cell in the semiconductor memory device according to Embodiment 1 of the present invention.
Figures 3, 4:
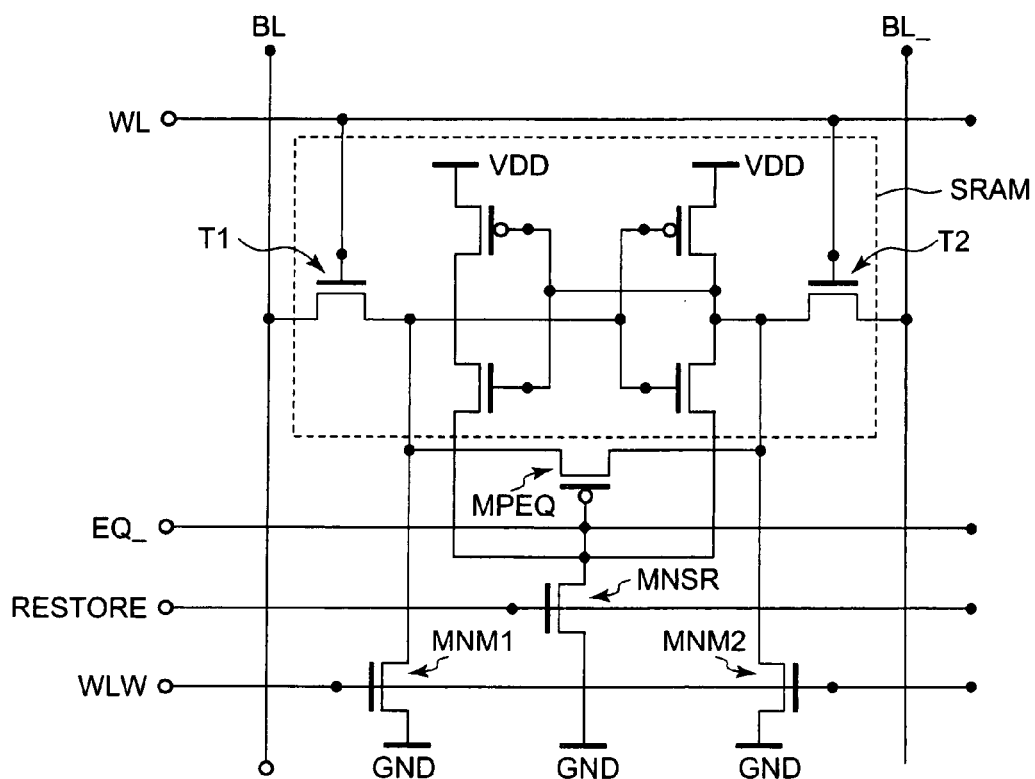
FIG. 3 is a table showing voltage conditions for operating the memory cell in the semiconductor memory device according to Embodiment of the present invention.
FIG. 4 is a circuit diagram schematically showing a configuration of an SRAM-integrated basic circuit according to Example 3, FIG. 5. is an explanatory diagram schematically showing a cross-sectional structure of a p-channel non-volatile memory cell included in a semiconductor device according to Example 4.
Figure 5:
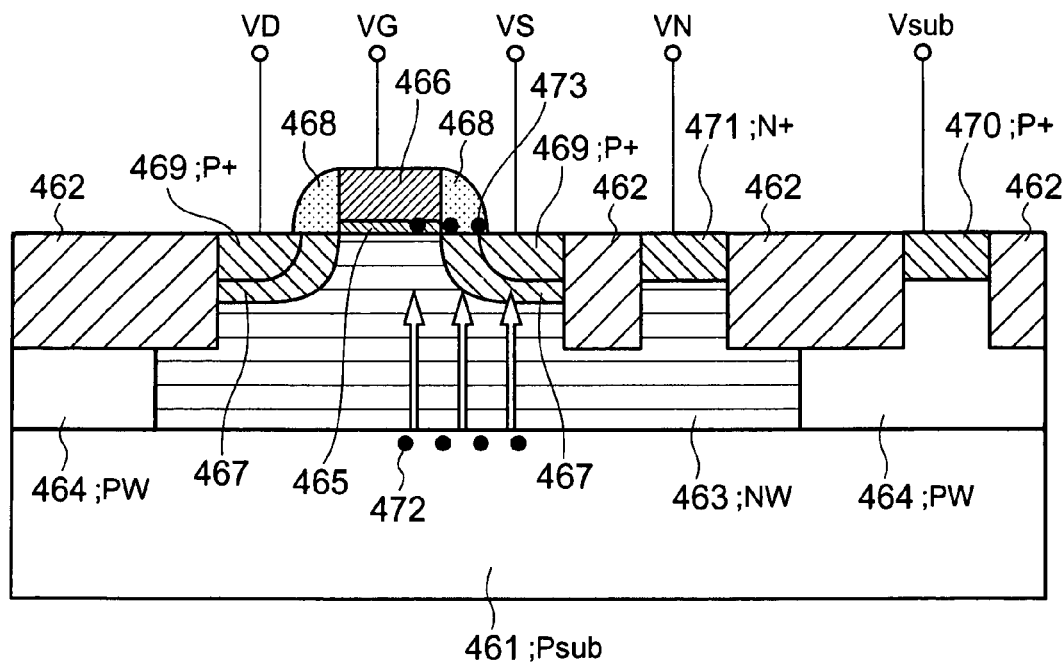
Figure 6:
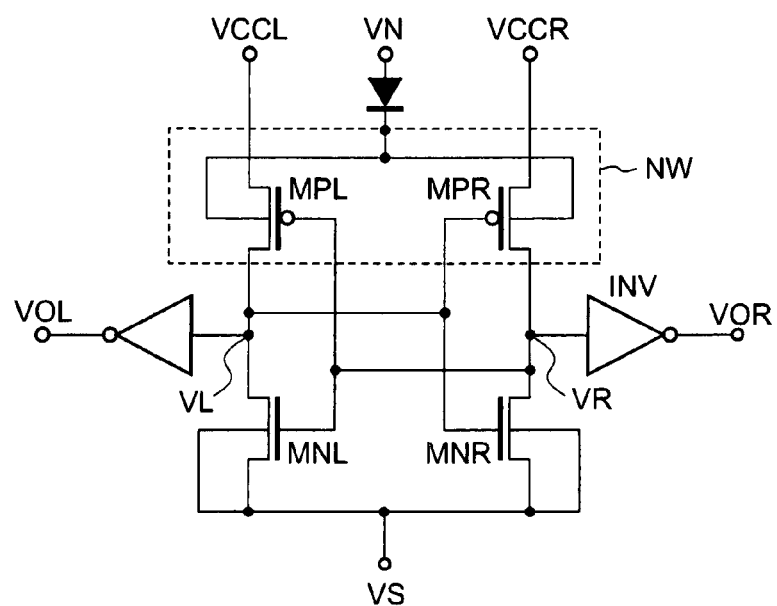
FIG. 6 shows an equivalent circuit of a source-line-division p-channel non-volatile memory cell included in the semiconductor device according to Example 4.

FIG. 1 is a circuit diagram schematically showing a configuration of a memory cell in the semiconductor memory device according to Embodiment 1 of the present invention. FIG. 2 is a partially cross-sectional view schematically showing a configuration of a first PMOS transistor in the memory cell in the semiconductor memory device according to Embodiment of the present invention. FIG. 3 is a table showing voltage conditions for operating the memory cell in the semiconductor memory device according to Embodiment of the present invention.

The semiconductor memory cell includes an SRAM (Static Random Access Memory) memory cell which does not need an operation for holding accumulated data (a refresh operation) (see FIG. 1). The SRAM cell includes PMOS transistors P1 and P2, NMOS transistors N1 and N2, and transfer MOS transistors T1 and T2. It is noted that PMOS and NMOS indicates to P-channel metal oxide semiconductor and N-channel metal oxide semiconductor, respectively.

The PMOS transistors P1 and P2 are formed in an n-type well 2 electrically connected to an n-type wiring NW, and thus constitute a flip flop. The gate of the PMOS transistor P1 is electrically connected to the gate of NMOS transistor N1, the drain of the PMOS transistor P2, the source of the NMOS transistor N2 and the drain of the transfer MOS transistor T2. The source of the PMOS transistor P1 is electrically connected to a first power supply wiring VDD. The gates of NMOS and PMOS may be made of a conductive material such as poly-silicon. The drain of the PMOS transistor P1 is electrically connected to the source of the NMOS transistor N1, the gate of the PMOS transistor P2, the gate of the NMOS transistor N2 and the drain of the transfer MOS transistor T1. The gate of the PMOS transistor P2 is electrically connected to the gate of the NMOS transistor N2, the drain of the PMOS transistor P1, the source of the NMOS transistor N1 and the drain of the transfer MOS transistor T1. The source of the PMOS transistor P2 is electrically connected to a first power supply wiring VDD. The drain of the PMOS transistor P2 is electrically connected to the source of the NMOS transistor N2, the gate of the PMOS transistor P1, the gate of the NMOS transistor N1 and the drain of the transfer MOS transistor T2.

The NMOS transistors N1 and N2 are formed in the p-type well. The gate of the NMOS transistor N1 is electrically connected to the gate of the PMOS transistor P11, the drain of the PMOS transistor P2, the source of the NMOS transistor N2 and the drain of the transfer MOS transistor T2. The source of the NMOS transistor N1 is electrically connected to the drain of the PMOS transistor P1, the gate of the PMOS transistor P2, the gate of the NMOS transistor N2 and the drain of the transfer MOS transistor T1. The drain of the NMOS transistor N1 is electrically connected to a second power supply wiring VSS. The gate of the NMOS transistor N2 is electrically connected to the gate of the PMOS transistor P2, the drain of the PMOS transistor P1, the source of the NMOS transistor N1 and the drain of the transfer MOS transistor T1. The source of the NMOS transistor N2 is electrically connected to the drain of the PMOS transistor P2, the gate of the PMOS transistor P1, the gate of the NMOS transistor N1 and the drain of the transfer MOS transistor T2. The drain of the NMOS transistor N2 is electrically connected to the second power supply wiring VSS.

The transfer MOS transistors T1 and T2 are selection transistors for choosing between a first storage node configured of the PMOS transistor P1 and the NMOS transistor N1 and a second storage node configured of the PMOS transistor P2 and the NMOS transistor N2. The gate of the transfer MOS transistor T1 is electrically connected to a first word line W1. The source of the transfer MOS transistor T1 is electrically connected to a first data line D1. The drain of the transfer MOS transistor T1 is electrically connected to the drain of the PMOS transistor P1, the source of the NMOS transistor N1, the gate of the PMOS transistor P2 and the gate of the NMOS transistor N2. The gate of the transfer MOS transistor T2 is electrically connected to a second word line W2. The source of the transfer MOS transistor T2 is electrically connected to a second data line D2. The drain of the transfer MOS transistor T2 is electrically connected to the gate of the PMOS transistor P1, the gate of the NMOS transistor N1, the drain of the PMOS transistor P2 and the source of the NMOS transistor N2. It should be noted that, unlike Conventional Example 3 (see FIG. 4), the gates of the transfer MOS transistors T1 and T2 are not electrically connected to each other in the case of Embodiment 1, and that the first and second word lines W1 and W2 are not electrically connected to each other.

Albeit not illustrated, a peripheral region of the SRAM cell includes a drive circuit serving as a peripheral circuit. The drive circuit controls voltages applied to the first data line D1, the second data line D2, the first word line W1, the second word line W2, the first power supply wiring VDD, the second power supply wiring VSS, a n-type well wiring NW and a substrate interconnect Vsub. Incidentally, descriptions will be provided for how the drive circuit controls the voltages.

Descriptions will be provided next for how the semiconductor memory device according to Embodiment 1 of the present invention operates.

In a case where data is written in the PMOS transistor P1, the drive circuit applies a write voltage VPP to the n-type well wiring NW and the first power supply wiring VDD. The write voltage VPP is a positive voltage, and its absolute value is not larger than a junction breakdown voltage. Thus, the second power supply wiring VSS is floated (Float, open). In addition, the positive voltage VPP is applied to the first word line W1; a ground voltage GND is applied to the first data line D1; and the ground voltage GND is applied to the second word line W2. Thus, the second data line D2 is floated (Float, open) Furthermore, the ground voltage GND is applied to the substrate interconnect Vsub (see FIGS. 1 to 3). Thereby, the write voltage VPP is applied to the n-type well 2 and the source of the PMOS transistor P1. The transfer MOS transistor T1 is turned on, and thus the ground voltage GND is applied to the drain of the PMOS transistor P1 (see FIG. 2). By this, while electrons 6 flow from a p$^+$ diffusion layer 3a as the source of the PMOS transistor P1 to a p$^+$ diffusion layer 3b as the drain of the PMOS transistor P1, parts of electrons 6 are trapped by a portion of the gate insulating film 4 under the gate electrode 5 of the PMOS transistor P1, the portion being close to the drain. This is a condition in which the data is written in the PMOS transistor P1.

In a case where data is written in the PMOS transistor P2, the drive circuit applies the write voltage VPP to the n-type well wiring NW and the first power supply wiring VDD. The write voltage VPP is a positive voltage, and its absolute value is not larger than the junction breakdown voltage. Thus, the second power supply wiring VSS is floated (Float, open). In addition, the ground voltage GND is applied to the first word line W1. Thus, the first data line D1 is floated (Float, open) Furthermore, the positive voltage VPP is applied to the second word line W2; the ground voltage GND is applied to the second data line D2; and the ground voltage GND is applied to the substrate interconnect Vsub (see FIGS. 1 and 3). Thereby, the write voltage VPP is applied to the n-type well 2 and the source of the PMOS transistor P2. The transfer MOS transistor T2 is turned on, and thus the ground voltage GND is applied to the drain of the PMOS transistor P2. By this, while electrons flow from a p$^+$ diffusion layer as the source of the PMOS transistor P2 to a p$^+$ diffusion layer as the drain of the PMOS transistor P2, parts of electrons are trapped by a portion of the gate insulating film under the gate electrode of the PMOS transistor P2, the portion being close to the drain, in common with the PMOS transistor P1 (see FIG. 2). This is a condition in which the data is written in the PMOS transistor P2.

In a case where data is read from the SRAM cell, the drive circuit applies a positive power supply voltage VCC to the n-type well wiring NW and the first power supply wiring VDD; the ground voltage GND is applied to the second power supply wiring VSS; the positive power supply voltage VCC is applied to the first word line W1; the positive power supply voltage VCC is applied to the second word line W2; and the ground voltage GND is applied to the substrate interconnect Vsub (see FIGS. 1 and 3). Thereby, the power supply voltage VCC is applied to the n-type well 2, the source of the PMOS transistor P1 and the source of the PMOS transistor P2. The transfer MOS transistors T1 and T2 are turned on. By this, the latch is fixed. Subsequently, electric potential conditions of the drain of the PMOS transistor P1 and the source of the NMOS transistor N1 (Data) are outputted to the first data line D1 via the transfer MOS transistor T1. Electric potential conditions of the drain of the PMOS transistor P2 and the source of the NMOS transistor N2 (Bar Data) are outputted to the second data line D2 via the transfer MOS transistor T2. The data is read from the SRAM cell in this manner.

In the case of Embodiment 1, a write operation is performed by accumulating electrons in the gate insulating film 5 instead of in a floating gate including a tunnel oxide film. This makes it possible to provide a highly-reliable semiconductor memory device having a high retention characteristic even through a CMOS process including forming a thin gate insulating film. In addition, because the write operation is performed by accumulating electrons 6 in the gate insulating film 5, electrons 6 trapped in the gate insulating film 5 are unable to move and are fixed there. For this reason, it is only parts of electrons that leak from a vicinity of defects in the gate insulating film 5, even if the gate insulating film 5 is defective. The defects do not affect most of the trapped electrons 6. This makes it possible to realize a non-volatile memory having a highly-reliable retention characteristic even through a process including forming a thin gate insulating film 5. Moreover, because no negative voltage is used during the write operation, the peripheral circuit is simplified. Additionally, because the write operation is performed on the PMOS transistors P1 and P2 by use of the drain avalanche hot electron injection theory, the injection efficiency is high. This makes it possible to increase the write rate.

What is claimed is:

1. A semiconductor memory device comprising:
   first and second PMOS transistors formed on an n-type well;
   first and second NMOS transistors formed on a p-type well;
   a first transfer MOS transistor, a source of the first transfer MOS transistor being electrically connected to a first data line, and a drain of the first transfer MOS transistor being electrically connected to a drain of the first PMOS transistor, a source of the first NMOS transistor, a gate of the second PMOS transistor and a gate of the second NMOS transistor;
   a second transfer MOS transistor, a source of the second transfer MOS transistor being electrically connected to a second data line, and a drain of the second transfer MOS transistor being electrically connected to a drain of the second PMOS transistor, a source of the second NMOS transistor, a gate of the first PMOS transistor and a gate of the first NMOS transistor;
   a first word line electrically connected to a gate of the first transfer MOS transistor;
   a second word line electrically connected to a gate of the second transfer MOS transistor; and
   a drive circuit for controlling voltages applied to at least the n-type well, the sources of the first and second PMOS transistors, the drains of the first and second NMOS transistors, the first word line, the second word line, the first data line, and the second data line,
   wherein, during a write operation of the first PMOS transistor, the drive circuit applies a positive voltage whose absolute value is not larger than a junction breakdown voltage to the n-type well as well as the sources of the first and second PMOS transistors, concurrently applying the positive voltage to the first word line and a ground voltage to the second word line and the first data line, such that the drive circuit performs the write operation by accumulating electrons in a gate insulating film of the first PMOS transistor by a drain avalanche hot electron injection.

2. The semiconductor memory device as claimed in claim 1, wherein, during a write operation of the second PMOS transistor, the drive circuit applies the positive voltage whose absolute value is not larger than the junction breakdown voltage to the n-type well as well as the sources of the first and second PMOS transistors, concurrently applying the positive voltage to the second word line and the ground voltage to the first word line and the second data line.

3. The semiconductor memory device as claimed in claim 1, wherein, during a read operation, the drive circuit applies the positive voltage to the n-type well as well as the sources of the first and second PMOS transistors, concurrently applying the ground voltage to the drains of the first and second NMOS transistors, and the positive voltage to both the first and second word lines.

4. A semiconductor memory device comprising:
   first and second PMOS transistors formed on an n-type well;
   first and second NMOS transistors formed on a p-type well;
   a first transfer MOS transistor containing a control gate coupled to a first word line, a first electrode coupled to a first data line, and a second electrode coupled to a connecting point of the first PMOS transistor and the first NMOS transistor and gates of the second PMOS transistor and the second NMOS transistor;
   a second transfer MOS transistor containing a control gate coupled to a second word line, a first electrode coupled to a second data line, and a second electrode coupled to a connecting point of the second PMOS transistor and the second NMOS transistor, and a second electrode coupled to gates of the first PMOS transistor and the first NMOS transistor; and
   a drive circuit, during a write operation of the first PMOS transistor, applying a positive voltage whose absolute value is not larger than a junction breakdown voltage to the n-type well as well as the sources of the first and second PMOS transistors, concurrently applying the positive voltage to the first word line and a ground voltage to the second word line and the first data line, such that the drive circuit performs the write operation by accumulating electrons in a gate insulating film of the first PMOS transistor by a drain avalanche hot electron injection.

5. The semiconductor memory device, as claimed in claim 1, wherein the drive circuit conducts the write operation to set a gate electrode of the first PMOS transistor in a floating state, and to set the drain of the first PMOS transistor to the ground voltage based on the applying the ground voltage to the first data line, so that electrons flow from the drain to the source of the first PMOS transistor.

6. The semiconductor memory device, as claimed in claim 5, wherein the first transfer MOS transistor transfers the ground voltage to the drain of the first PMOS transistor during the write operation, and
   wherein the drive circuit conducts a read operation to apply a read voltage to a gate of the first transfer MOS transistor to convey a voltage potential at the drain of the first PMOS transistor to the first data line via the first transfer MOS transistor.

7. The semiconductor memory device, as claimed in claim 4, wherein the drive circuit conducts the write operation to set a gate electrode of the first PMOS transistor in a floating state, and to set the drain of the first PMOS transistor to the ground voltage based on the applying the ground voltage to the first data line, so that electrons flow from the drain to the source of the first PMOS transistor.

8. The semiconductor memory device, as claimed in claim 7, wherein the first transfer MOS transistor transfers the ground voltage to the drain of the first PMOS transistor during the write operation, and
   wherein the drive circuit conducts a read operation to apply a read voltage to a gate of the first transfer MOS transistor to convey a voltage potential at the drain of the first PMOS transistor to the first data line via the first transfer MOS transistor.

9. The semiconductor memory device, as claimed in claim 1, wherein the positive voltage includes a programming voltage enough to perform the drain avalanche hot electron injection.

10. The semiconductor memory device, as claimed in claim 4, wherein the positive voltage includes a programming voltage enough to perform the drain avalanche hot electron injection.

11. A method of controlling a write operation or a read operation of a SRAM cell including two load transistors and driving transistors constituting a flip-flop circuit, and two transfer gates, comprising:

during the write operation:

applying a first write positive voltage to a well region of one of the load transistors;

applying a second write positive voltage to a source of the one of the load transistors;

applying a ground voltage to a drain of the one of the load transistors; and performing the write operation by accumulating electrons in a gate insulating film of the one of the load transistors by a drain avalanche hot electron injection.

12. The method as claimed in claim 11, wherein the ground voltage is applied through one of the transfer gates from a bit line, and wherein the read operation is conducted to read out a potential at the drain of the one of the load transistors through the one of the transfer gates to the bit line.

13. The method as claimed in claim 12, further comprising:

during the write operation, setting a control gate of the one of the load transistors in a floating state.

14. The method, as claimed in claim 11, wherein the first and second write positive voltages include a programming voltage enough to perform the drain avalanche hot electron injection.

* * * * *